US009799702B2

(12) United States Patent
Cheng et al.

(10) Patent No.: US 9,799,702 B2
(45) Date of Patent: Oct. 24, 2017

(54) DEEP TRENCH ISOLATION STRUCTURE AND METHOD OF FORMING SAME

(71) Applicant: Taiwan Semiconductor Manufacturing Company, Ltd., Hsin-Chu (TW)

(72) Inventors: Yu-Hung Cheng, Tainan (TW); Yeur-Luen Tu, Taichung (TW); Tung-I Lin, Tainan (TW); Cheng-Lung Wu, Tainan (TW); Wei-Li Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/079,781

(22) Filed: Mar. 24, 2016

(65) Prior Publication Data
US 2017/0278893 A1 Sep. 28, 2017

(51) Int. Cl.
*H01L 27/14* (2006.01)
*H01L 27/146* (2006.01)

(52) U.S. Cl.
CPC .... *H01L 27/14683* (2013.01); *H01L 27/1463* (2013.01); *H01L 27/1464* (2013.01)

(58) Field of Classification Search
CPC .......... H01L 21/30604; H01L 21/3085; H01L 21/76224; H01L 21/76237; H01L 27/1463; H01L 27/14689; H01L 29/0649; H01L 29/66553; H01L 27/14683; H01L 27/1464
USPC .......................... 257/431, 192, 510, 443, 446
See application file for complete search history.

(56) References Cited

U.S. PATENT DOCUMENTS

| 7,279,770 | B2 * | 10/2007 | Mouli ................. H01L 27/1463 257/223 |
| 7,358,108 | B2 * | 4/2008 | Han ................... H01L 27/14609 257/514 |
| 7,800,192 | B2 | 9/2010 | Venezia et al. |
| 2009/0096055 | A1 * | 4/2009 | Montgomery .... H01L 21/76232 257/510 |

(Continued)

OTHER PUBLICATIONS

Koester, S.J., et al., "Ge-on-SOI-Detector/Si-CMOS-Amplifier Receivers for High-Performance Optical-Communication Applications," Journal of Lightwave Technology, vol. 25, No. 1, Jan. 2007, pp. 46-57.

(Continued)

*Primary Examiner* — Mohammed Shamsuzzaman
(74) *Attorney, Agent, or Firm* — Slater Matsil, LLP

(57) ABSTRACT

Deep trench isolation (DTI) structures and methods of forming the same are provided. A method includes forming a plurality of photosensitive regions in a substrate. A recess is formed in the substrate, the substrate comprising a first semiconductor material, the recess being interposed between adjacent photosensitive regions. The recess is enlarged by removing a damaged layer of the substrate along sidewalls of the recess, thereby forming an enlarged recess. An epitaxial region is formed on sidewalls and a bottom of the enlarged recess, at least a portion of the epitaxial region comprising a second semiconductor material, the second semiconductor material being different from the first semiconductor material. A dielectric region is formed on the epitaxial region, the epitaxial region extending along a sidewall of the dielectric region.

20 Claims, 15 Drawing Sheets

(56) References Cited

U.S. PATENT DOCUMENTS

| | | | | |
|---|---|---|---|---|
| 2012/0223364 A1* | 9/2012 | Chung | ............ | H01L 21/823807 257/192 |
| 2014/0035087 A1* | 2/2014 | Liu | ..................... | H01L 27/1463 257/443 |
| 2014/0319581 A1* | 10/2014 | Sung | ................. | H01L 21/26586 257/192 |
| 2015/0130016 A1* | 5/2015 | Kao | .................... | H01L 27/1463 257/510 |
| 2015/0279878 A1* | 10/2015 | Ahmed | ............... | H01L 27/1463 257/446 |

OTHER PUBLICATIONS

"Gradient-index optics," Wikipedia, the Free Encyclopedia, https://en.wikipedia.org/wiki/Gradient-index_optics, last modified Nov. 27, 2015, 2 pages.

* cited by examiner

DEEP TRENCH ISOLATION STRUCTURE AND METHOD OF FORMING SAME

BACKGROUND

Image sensor chips, which include front-side illumination (FSI) image sensor chips and backside illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the FSI image sensor chips, color filters and micro-lenses are formed over the interconnector structure. In the formation of the BSI image sensor chips, after the formation of the interconnect structure, a backside of the wafer is thinned and backside structures, such as color filters and micro-lenses, are formed on the backside of the respective wafer. When the image sensor chips are used, light is projected on the image sensors, in which the light is converted into electrical signals.

In the image sensor chips, deep trenches are formed in the silicon substrate to separate the image sensors from each other. The deep trenches are filled with dielectric materials, which may include an oxide, to isolate the neighboring devices from each other.

The image sensors in the image sensor chips generate electrical signals in response to the stimulation of photons. The light received by one micro-lens and the underlying color filter, however, may be tilted. The tilted light may penetrate through the deep trench that is used to separate the image sensors. As a result, cross-talk occurs due to the interference of the light that is undesirably received from neighboring pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 5A illustrate the cross-sectional views of intermediate stages in the formation of deep trench isolation (DTI) structures in accordance with some embodiments.

DETAILED DESCRIPTION

Figure 1:
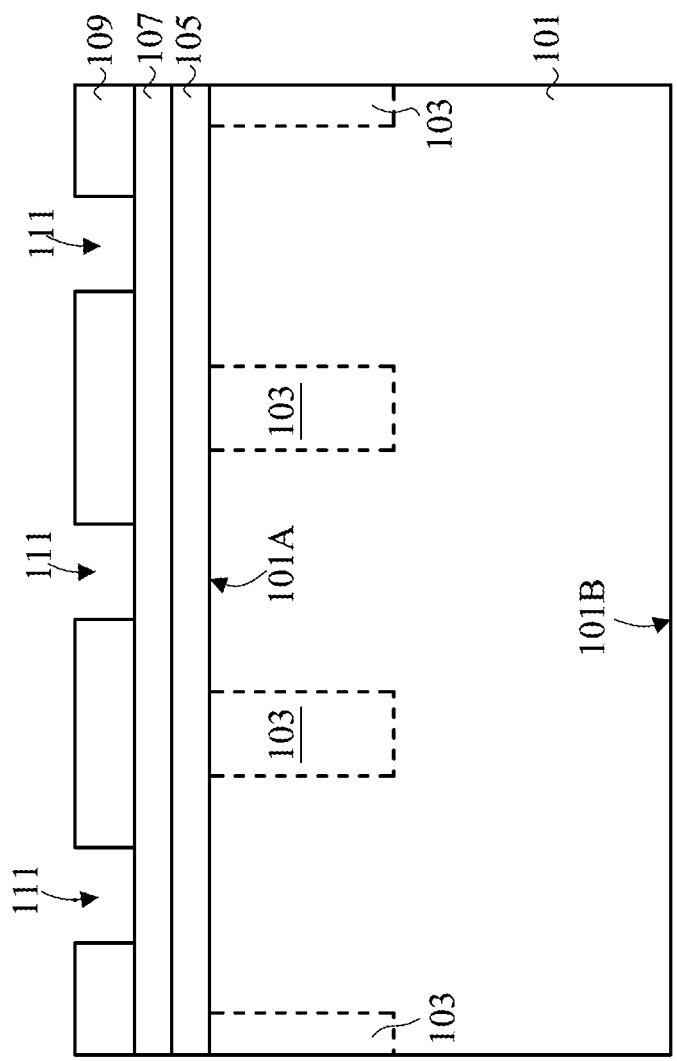

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deep trench isolation (DTI) structures and methods of forming the same are provided in accordance with various exemplary embodiments. The intermediate stages of forming the DTI structures are illustrated. Furthermore, various image sensors having DTI structures are provided in accordance with various exemplary embodiments. Some variations of embodiments are discussed. Throughout various views and illustrative embodiments, like reference numbers are used to designate like elements. Various embodiments include DTI structures disposed between adjacent photo-sensitive elements (e.g., photodiode devices) in a substrate. DTI structures have dielectric regions and epitaxial regions formed of a semiconductor material. DTI structures allow for reducing a cross-talk between adjacent photo-sensitive elements and allow for improving quantum efficiency for red and infrared (including near infrared (NIR) and far infrared (FIR)) applications.

FIGS. 1 through 5A illustrate the cross-sectional views of intermediate stages in the formation of DTI structures in accordance with some embodiments. The DTI structures may be used in image sensor chips (such as front-side illumination (FSI) image sensor chips or backside illumination (BSI) image sensor chips) in accordance with some embodiments. Referring to FIG. 1, a substrate 101 is provided. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 101 has a first surface 101A and a second surface 101B opposite the first surface 101A. The first surface 101A may also be referred to as a front surface 101A on which active devices such as transistors are formed, and the second surface 101B may also be referred to as a back surface 101B. As described below in greater detail below, the DTI structures are formed from the front surface 101A of the substrate 101. One skilled in the art would appreciate that similar methods can be applied to DTI structures formed from the back surface 101B of the substrate 101.

A plurality of photosensitive regions 103 are formed in the substrate 101. The photosensitive regions 103 include respective photosensitive devices (not illustrated), which may be formed, for example, by implanting suitable impurity ions. In some embodiments, the impurity ions may be implanted in an epitaxial layer (not illustrated) within the substrate 101. The photosensitive devices are configured to convert light signals (e.g., photons) to electrical signals, and may be PN junction photo-diodes, PNP photo-transistors, NPN photo-transistors, or the like. For example, the photosensitive regions 103 may include an n-type implantation region formed within a p-type semiconductor layer (e.g., at least a portion of the substrate 101). In such embodiments, the p-type substrate may isolate and reduce electrical cross-talk between adjacent photosensitive regions 103. In some embodiments, the photosensitive regions 103 are arranged in a two-dimensional rectangular array as viewed from top (not illustrated in FIG. 1, see FIG. 5B).

Referring further to FIG. 1, a mask layer 105, an anti-reflective coating (ARC) layer 107, and a photoresist layer 109 are formed on the first surface 101A of the substrate 101. The mask layer 105 may comprise one or more oxide (e.g., silicon oxide) and/or nitride (e.g., silicon nitride) layers to protect the underlying substrate 101 during patterning. The mask layer 105 may be blanket deposited over substrate 101 using any suitable deposition process, such as, atomic layer deposition (ALD), chemical vapor deposition (CVD), high density plasma CVD (HDP-CVD), physical vapor deposition (PVD), thermal oxidation, thermal nitridation, and the like. The mask layer 105 may also act as an etch stop layer for etching the ARC layer 107.

After the mask layer 105 is formed, the ARC layer 107 and the photoresist layer 109 may be blanket deposited over the mask layer 105. The ARC layer 107 and photoresist layer 109 are formed to aid in the patterning of the mask layer 105. For example, the ARC layer 107 helps to reduce a reflection from underlying layers during photolithography, and the photoresist layer 109 may be used to transfer a pattern to the mask layer 105. In some embodiments, the ARC layer 107 may be formed using similar materials and methods as the mask layer 105 and the description is not repeated herein. In an embodiment, the mask layer 105 may be formed of silicon oxide and the ARC layer 107 may be formed of silicon nitride.

In some embodiments, the photoresist layer 109 may be patterned to include a plurality of openings 111 by exposing the photoresist layer 109 to light (e.g., ultraviolet light) using a photomask (not shown). Exposed or unexposed portions of the photoresist layer 109 may then be removed depending on whether a positive or negative resist is used to form the openings 111. The openings 111 may be aligned with an area of substrate 101 disposed between adjacent photosensitive regions 103. The pattern of the photoresist layer 109 (e.g., the openings 111) is then transferred through the ARC layer 107 and the mask layer 105 to the substrate 101 (e.g., using a suitable etching process).

Figure 2:
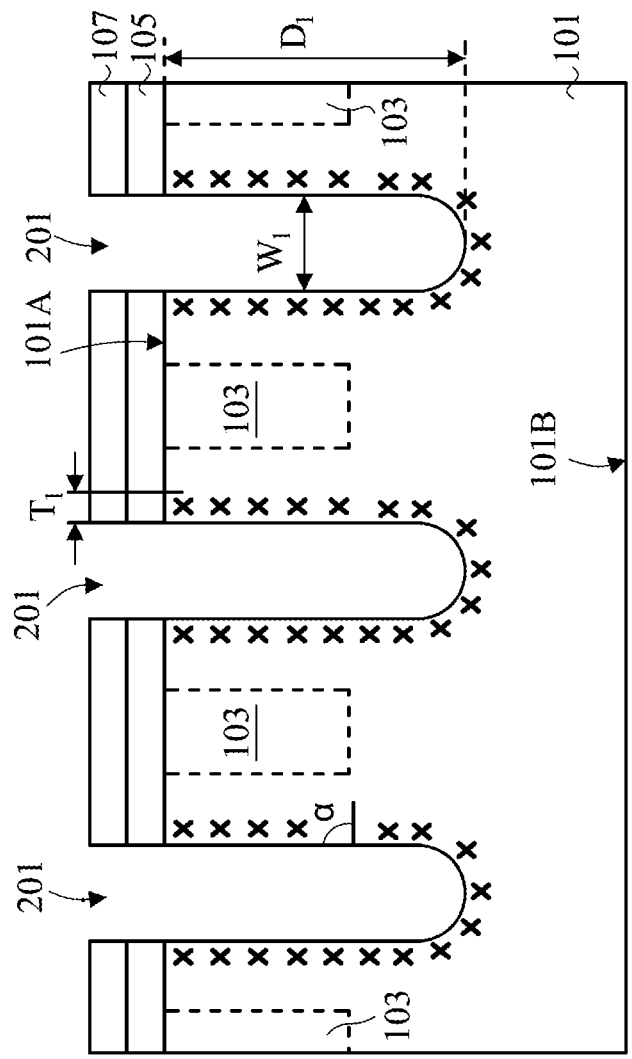

Referring to FIG. 2, the photoresist layer 109 is used as an etch mask to etch the underlying layers. Accordingly, a plurality of recesses 201 are formed through the ARC layer 107, the mask layer 105, and extend into the substrate 101. The recesses 201 extend from the first surface 101A into the substrate 101 such that bottoms of the recesses 201 are at an intermediate level between the first surface 101A and the second surface 101B of the substrate 101. The etching of the substrate 101 may include acceptable etch processes, which may be performed at a relatively low-temperature (e.g., less than about 400° C.) to reduce damage to other features (e.g., electrical components, interconnect structures, and the like) within an image sensor chip. The etching may be anisotropic, so that sidewalls of the recesses 201 are straight, vertical, and substantially perpendicular to the first surface 101A and the second surface 101B of substrate 101. Furthermore, there may be process variations, causing the recesses 201 to be slightly tapered, and hence the sidewalls of recesses 201 are substantially perpendicular to (with a slight tilting) the first surface 101A and the second surface 101B, for example, with a tilt angle α between about 88 degrees and about 90 degrees. In some embodiments in which the substrate 101 is formed of Si, the etching is performed using a dry etching method including, and not limited to, inductively coupled plasma (ICP), transformer coupled plasma (TCP), electron cyclotron resonance (ECR), reactive ion etch (RIE), and the like. The process gases include, for example, fluorine-containing gases (such as $SF_6$, $CF_4$, $CHF_3$, $NF_3$), chlorine-containing gases (such as $Cl_2$), $Br_2$, HBr, $BCl_3$ and/or the like. In some embodiments, the photoresist layer 109 is consumed during the etching. In other embodiments, remaining portions of the photoresist layer 109 may be removed in an ashing and/or wet strip processes, for example.

In the resulting structure, the recesses 201 extend into the substrate 101 and are disposed between adjacent photosensitive regions 103. In some embodiments, a depth $D_1$ of the recesses 201 is between about 1.5 μm and about 7 μm, and a width $W_1$ of recesses 201 is between about 0.05 μm and about 0.3 μm. It is appreciated, however, that the values recited throughout the description are merely examples, and may be changed to different values. Aspect ratio $D_1/W_1$ of recesses 201 may be between about 5 and about 50, for example. The bottom surfaces of the recesses 201 may be rounded and have a U-shape in the cross-sectional view. A rounded portion of each recess 201 may be curved all the way from a first vertical sidewall of the respective recess 201 to a second vertical sidewall of the respective recess 201, with the second vertical sidewall being opposite the first vertical sidewall.

Figure 3:
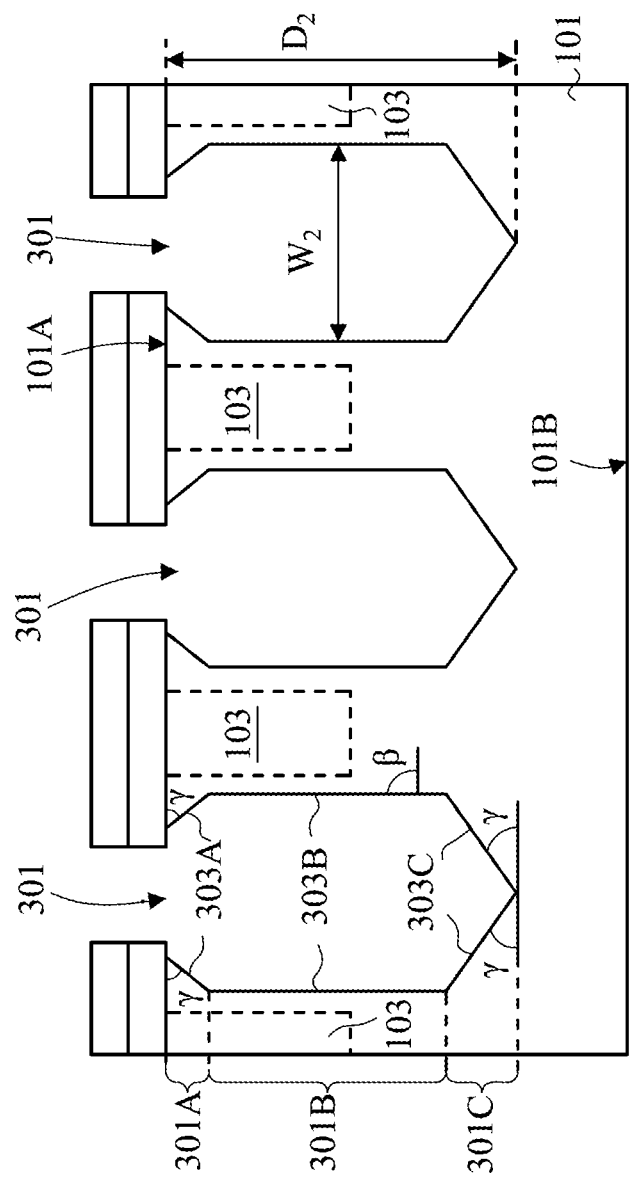

As a result of the etching process, surfaces of the substrate 102 exposed within the recesses 201 may be damaged (e.g., as a result of bombardment of etching atoms). The damage may include atom displacement, vacancy, and/or the like, which are symbolized by the "x" signs. The damaged surface layer causes an increase in the dark currents (e.g., current generated by photodiode devices when not exposed to light) of photosensitive pixels when the resulting DTI structures are used for isolating the photosensitive pixels. The damaged surface layer may also cause an increase in white pixels, which are the pixels generating dark currents when not exposed to light. Accordingly, the damaged surface layer is reduced and/or removed in a damage removal step, as shown in FIG. 3. In some embodiments, the damaged surface layer may have a thickness $T_1$ between about 3 nm and about 20 nm.

Referring further to FIG. 2, in the illustrated embodiment, the individual photosensitive regions 103 are formed in the substrate 101 before forming the recesses 201. In other embodiments, a single continuous photosensitive region may be formed in the substrate 101 before forming the recesses 201. In such embodiments, the recesses 201 divide the single continuous photosensitive region into the individual photosensitive regions 103. In yet other embodiments, the individual photosensitive regions 103 are formed in the substrate 101 after forming the recesses 201.

Referring to FIG. 3, a damage removal step is performed to remove the damaged surface layer within the recesses 201. In some embodiments, a thickness of removed layer may equal to at least about $T_1$ (see FIG. 2). Accordingly, after the damage removal step, the displacements, vacancies, and the like are reduced and/or removed. The damage removal step may comprise a wet etch, which may be performed using an alkaline-containing (base-containing) solution, while using the mask layer 105 and the ARC layer 107 as a combined etch mask. In other embodiments, the ARC layer 107 may be removed and the mask layer 105 may be used as an etch mask. In some embodiments in which the substrate 101 is formed of Si, tetra-methyl ammonium hydroxide (TMAH) is used in the damage removal step. In other embodiments, $NH_4OH$, potassium hydroxide (KOH), sodium hydroxide (NaOH), or the like is used to remove the damaged surface layer. A thickness of the removed surface layer may be between about 10 nm and about 100 nm, such as about 50 nm.

Due to the anisotropic nature of the wet etching process used in the damage removal step, the recesses 201 are transformed into recesses 301, which have faceted sidewalls. In some embodiments in which the first surface 101A is a (100) surface of the substrate 101, each recess 301 has an upper portion 301A, a middle portion 301B, and a lower portion 301C, such that the middle portion 301B is interposed between the upper portion 301A and the lower portion 301C. The middle portion 301B has substantially vertical sidewalls 303B, with a tilt angle β between about 88 degrees and about 90 degrees. The upper portion 301A has slanted sidewalls 303A, which expose (111) surface planes of the substrate 101. Accordingly, the slanted sidewalls 303A have a tilt angle γ of about 54.7 degrees. The lower portion 301C has slanted surfaces 303C, which in combination form a bottom surface of the recess 301. In some embodiments, slanted surfaces 303C are formed on (111) surface planes of the substrate 101. Accordingly, the slanted surfaces 303C have the tilt angle γ of about 54.7 degrees. In some embodiments, the recess 301 may have a depth $D_2$ between about 1.0 μm and about 7.0 μm and the middle portion 301B of the recess 301 may have a width $W_2$ between about 100 nm and about 300 nm. In some embodiments, a shape of the recesses 301 depends on the process parameters such as, for example, a duration of the damage removal process. In other embodiments, the lower portion 301C may have a horizontal surface (not illustrated) having a (100) crystal orientation, which connects two slanted surfaces (similar to the slanted surfaces 303C) formed on (111) surfaces of the substrate 101.

As described below in greater detail below, an epitaxial region comprising one or more epitaxial layers of suitable semiconductor materials are formed in the recesses 301. The semiconductor materials of the one or more epitaxial layers may be chosen depending on desired absorption characteristics the epitaxial region. In some embodiments in which absorption in red, near infrared (NIR) and far infrared (FIR) bands is desired, the semiconductor materials may include Ge, IV-IV semiconductor materials such as SiGe, or the like. In other embodiments, the semiconductor materials may include III-V semiconductor materials such as GaAs, or the like. In some embodiments, an epitaxial region comprising one or more epitaxial layers, such as $Si_{1-x}Ge_x$ (with 0≤x≤1) layers, is formed in the recesses 301 using a selective epitaxial growth (SEG) process. In some embodiments, $Si_{1-x}Ge_x$ is formed where x is an atomic fraction of Ge, with x=0 corresponding to Si and x=1 corresponding to Ge. In some embodiments, a SEG process may be performed at a temperature between of about 350° C. to about 750° C. using atomic pressure chemical vapor deposition (APCVD), low pressure chemical vapor deposition (LPCVD), reduced pressure chemical vapor deposition (RPCVD), ultra high vacuum chemical vapor deposition (UHVCVD), or the like. Process gases such as $GeH_4$, $GeH_3CH_3$, $(GeH_3)_2CH_2$, or the like may be used as a source gas for Ge. Process gases such as $SiH_4$, $SiH_2Cl_2$, $SiCl_4$, or the like may be used as a source gas for Si. HCl may be used as an etchant and $H_2$ as carrier gas. In some embodiments, the one or more $Si_{1-x}Ge_x$ layers may be in situ doped using B, P or As to obtain layers of desired conductivity. In some embodiments, $B_2H_6$, $PH_3$, and $AsH_3$ may be used as source gases for B, P and As, respectively. By performing a SEG process at a low temperature between of about 350° C. to about 750° C., the critical thickness of the epitaxial layers may be advantageously increased.

Figure 4:
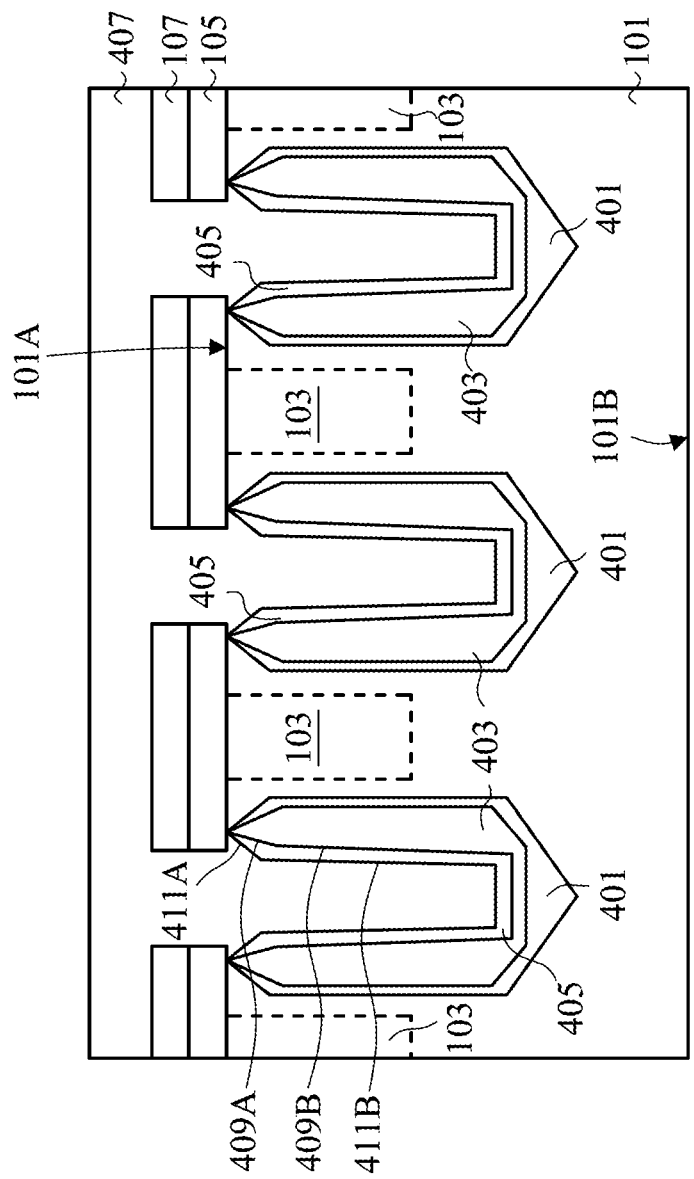

Referring to FIG. 4, a first epitaxial layer 401 comprising B doped Si (Si:B) is formed in the recesses 201 using low-temperature epitaxy. In some embodiments, in addition to the first epitaxial layer 401 that is formed on sidewalls and bottoms of the recesses 301, an amorphous layer of Si:B (not shown), having an etch selectivity different from the first epitaxial layer 401, is formed over the ARC layer 107. Subsequently, the amorphous layer is selectively removed using suitable dry or wet etching processes. In some embodiment, a thickness of the first epitaxial layer 401 is between about 50 nm and about 100 nm.

A second epitaxial layer 403 is formed in the recesses 301 over the first epitaxial layer 401. In some embodiments, The second epitaxial layer 403 may be formed of P doped $Si_{1-y}Ge_y$ (SiGe:P) using a SEG process. In some embodiments, while forming the SiGe:P, amount of Ge source gas may be gradually increased. In such embodiments, an atomic fraction y of Ge may also increase. In the illustrated embodiment, the atomic fraction y of Ge increases from 0 to about 0.6 as a thickness of the second epitaxial layer 403 increases. In some embodiments, a thickness of the second epitaxial layer 403 is between about 50 nm and about 100 nm. It is appreciated, however, that these values are merely examples, and may be changed to different values.

A third epitaxial layer 405 is formed in the recesses 301 over the second epitaxial layer 403. In some embodiments, the third epitaxial layer 405 may be formed of B doped $Si_{1-z}Ge_z$ (SiGe:B) using a SEG process. In other embodiments, the third epitaxial layer 405 may be formed of B doped Si (Si:B) using a SEG process. In the illustrated embodiment, an atomic fraction z of Ge in SiGe:B is about 0.6. In some embodiment, a thickness of the third epitaxial layer 405 is between about 10 nm and about 30 nm. It is appreciated, however, that these values are merely examples, and may be changed to different values.

As illustrates in FIG. 4, top surfaces of the first epitaxial layer 401, the second epitaxial layer 403 and the third epitaxial layer 405 are faceted surfaces such that orientation of facets change as the epitaxial layers fill the recesses 301. In some embodiments, a first portion 409A of the top surface of the second epitaxial layer 403 and a first portion 411A of the top surface of the third epitaxial layer 405 may have a tilt angle between about 70 degrees and about 80 degrees, and a second portion 409B of the top surface of the second epitaxial layer 403 and a second portion 411B of the top surface of the third epitaxial layer 405 may have a tilt angle between about 45 degrees and about 55 degrees.

In some embodiments, after forming the first epitaxial layer 401, the second epitaxial layer 403 and the third epitaxial layer 405, remaining portions of the recesses 301 are filled with a dielectric material 407. In some embodiments, the dielectric material 407 may comprise an oxide, such as silicon oxide, and may be formed using ALD, CVD, thermal oxidation, or the like. In some embodiments, the dielectric material 407 may electrically isolate adjacent photosensitive regions 103 from each other.

Figure 5A:
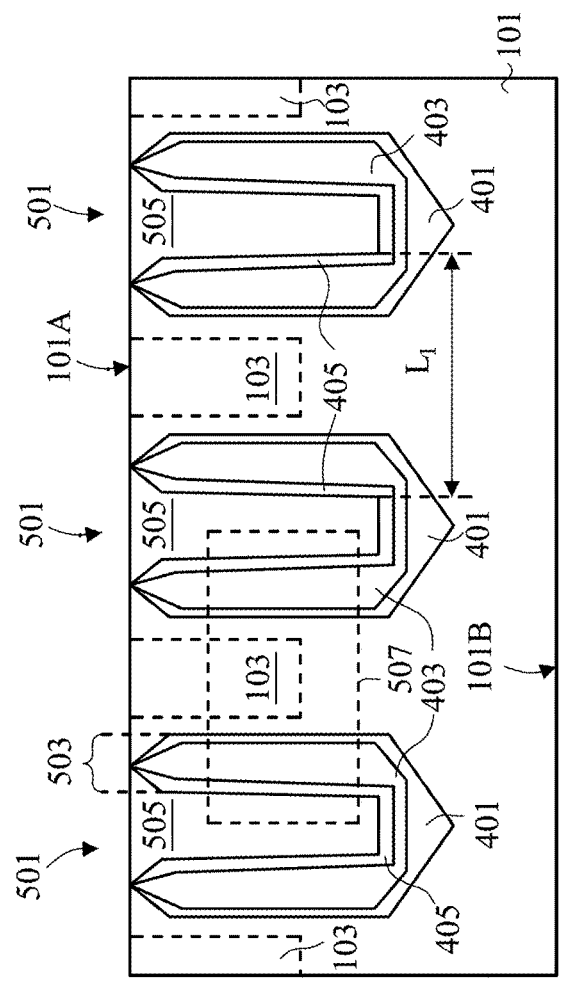

Referring to FIG. 5A, the dielectric material 407 is planarized such that a topmost surface of the dielectric material 407 is substantially coplanar with the first surface 101A of the substrate 101. In some embodiments, the palanarization process also removes the mask layer 105 and the ARC layer 107. In some embodiments, the dielectric material 407 may be palanarized using a chemical mechanical polishing (CMP) process, a grinding process, an etch processes, or the like. Portions of the first epitaxial layer 401, the second epitaxial layer 403, the third epitaxial layer 405 and the dielectric material 407 in each recess 201 form a respective DTI structure 501. Portions of the first epitaxial layer 401, the second epitaxial layer 403 and the third epitaxial layer 405 in each recess 301 may be collectively referred to as an epitaxial region 503 of a respective DTI structure 501. A portion of the dielectric material 407 in each recess 301 may be also referred to as a dielectric region 505 of a respective DTI structure 501. By including Ge in the epitaxial regions 503 of the DTI structures 501, absorption of light having a wavelength between about 0.6 μm and 1.55 μm (Red and NIR bands) may be advantageously increased compared to epitaxial regions formed of pure Si.

Figure 5B:
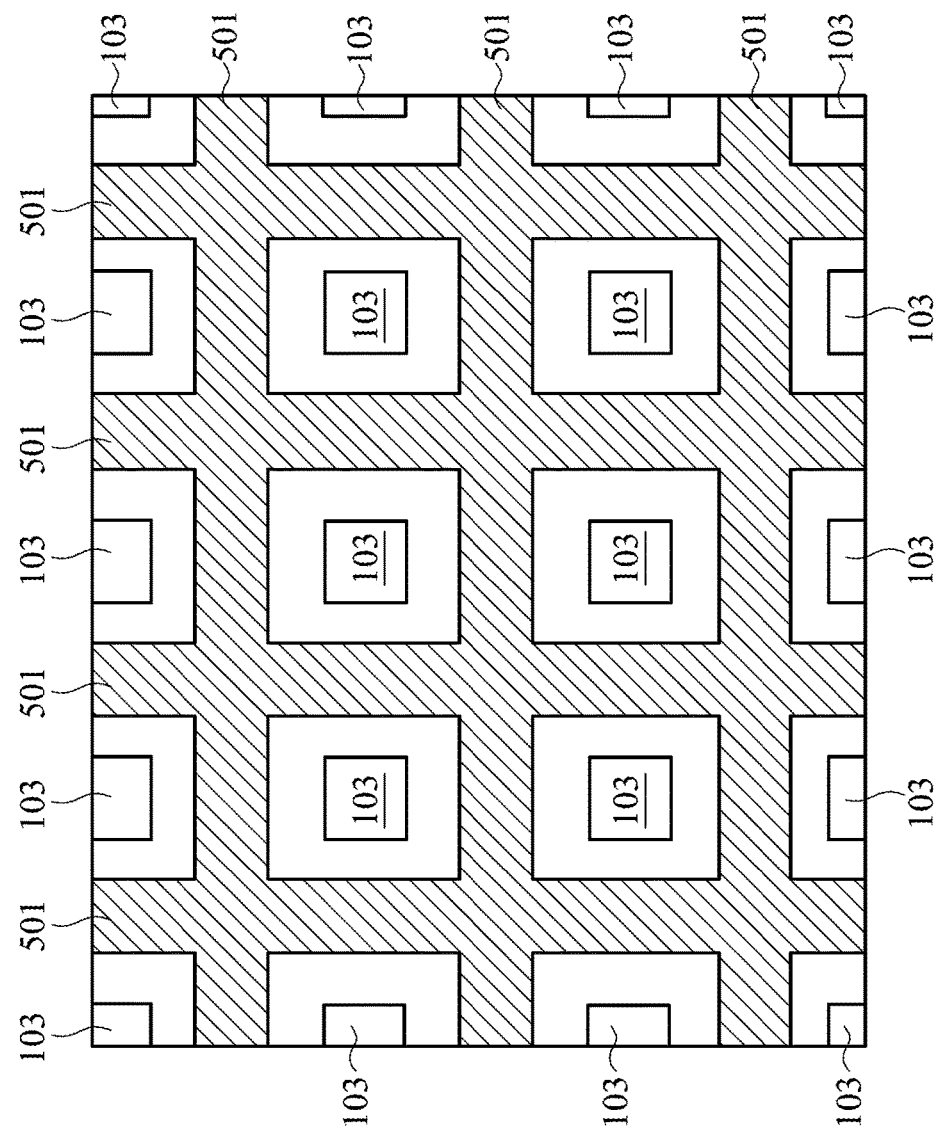
FIG. 5B illustrates a top view of deep trench isolation (DTI) structures in accordance with some embodiments.

FIG. 5B illustrates a top view of the DTI structures 501. In some embodiments, the DTI structures 501 form a grid, which separates each individual photosensitive region 103 from adjacent photosensitive regions 103 in a pixel array. In the illustrated embodiment, the DTI structures 501 form a plurality of strips, including a first plurality of strips extending in the X-direction, and a second plurality of strips extending in the Y-direction, which is perpendicular to the X-direction. Hence, the first plurality of strips and the second plurality of strips form a grid pattern, with a plurality of portions of the substrate 101 (e.g., having photosensitive regions 103 disposed therein) separated from each other, and defined by, the grid.

Figure 5C:
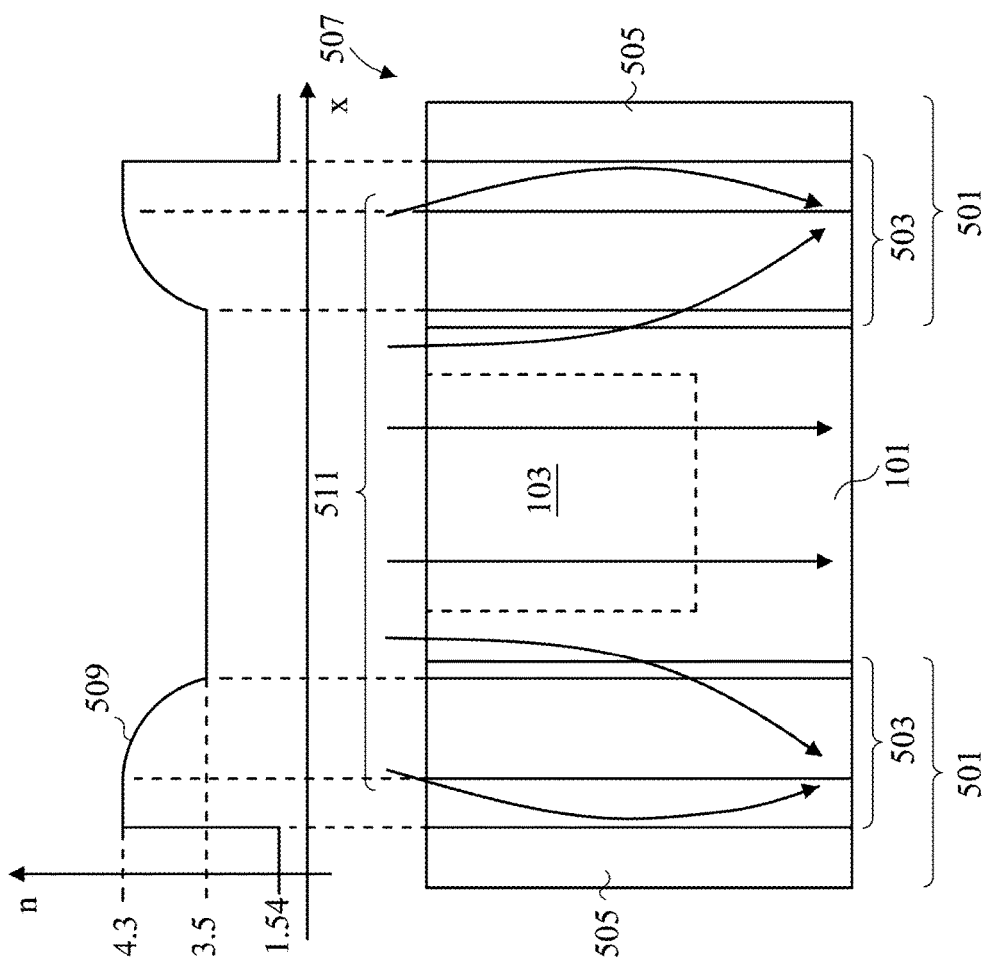
FIG. 5C illustrates an enlarged view of a region of a substrate interposed between adjacent deep trench isolation (DTI) structures in accordance with some embodiments.

FIG. 5C illustrates an enlarged view of a region 507 of the substrate 101 shown in FIG. 5A in accordance with some embodiments. The region 507 includes a portion of the substrate interposed between adjacent DTI structures 501. FIG. 5C further illustrates a profile 509 of a refractive index n in an X direction, wherein the X direction is parallel to the first surface 101A of the substrate 101 and extends from one DTI structure 501 to an adjacent DTI structure 501. Due to the gradient of the atomic fraction of Ge in the epitaxial regions 503 of the DTI structures 501, the refractive index also has gradient, with the refractive index increasing with increasing the atomic fraction of Ge. Accordingly, the region 507 has a non-uniform profile 509 of the refractive index n. Consequently, light (denoted by arrows 511) entering from the first surface 101A bends towards regions of a high refractive index and may effectively focus into regions of the high refractive index (e.g., the epitaxial regions 503). By focusing light in the epitaxial regions 503 of the DTI structures 501, light coupling efficiency to the epitaxial regions 503 is increased, which further improves Red/NIR properties of an image sensor chip. Furthermore, the non-uniform profile 509 of the refractive index further reduces cross-talk between adjacent photosensitive regions 103. Referring further to FIG. 5A, in some embodiments, quantum efficiency of an image sensor chip for Red/NIR bands may be further increased by shrinking a distance between adjacent DTI structures 501 without shrinking a thickness of the epitaxial regions 503. For example, by shrinking a distance $L_1$ from about 1000 nm to about 300 nm, a volume percentage of the epitaxial regions 503 may increase from about 14% to about 47%.

Figure 6A:
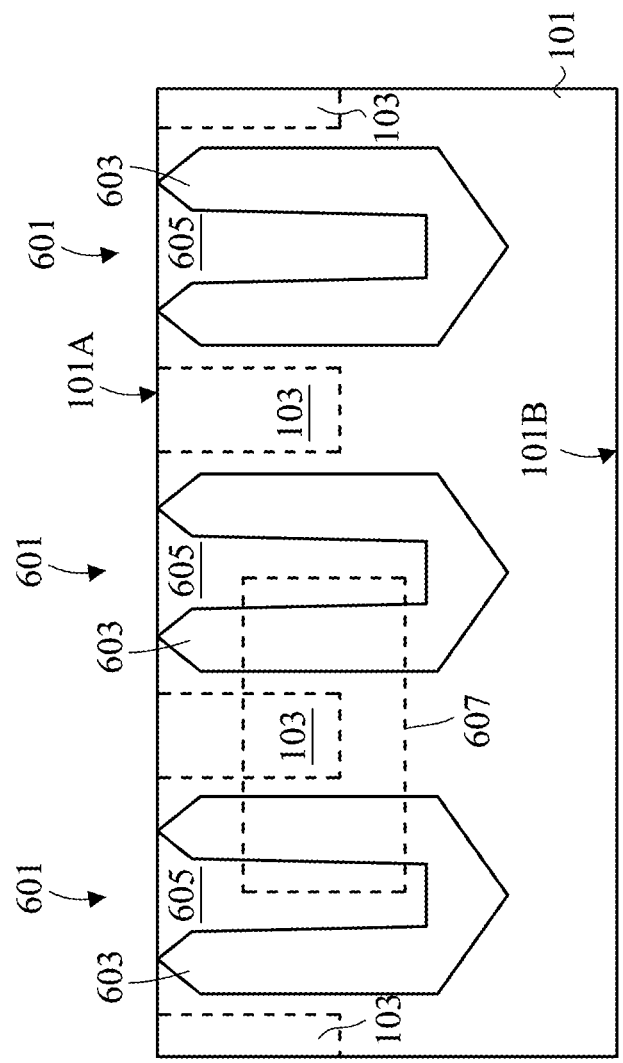
FIG. 6A illustrates a cross-sectional view deep trench isolation (DTI) structures in accordance with some embodiments.
Figure 6B:
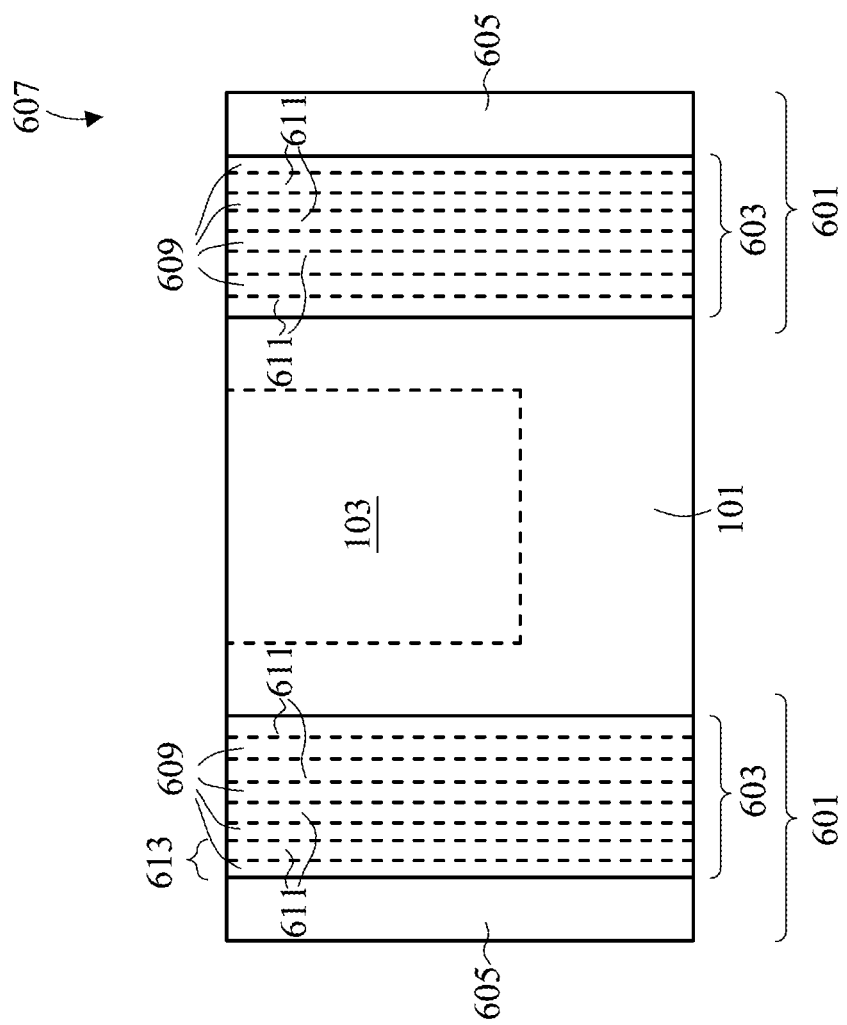
FIG. 6B illustrates an enlarged view of a region of a substrate interposed between adjacent deep trench isolation (DTI) structures in accordance with some embodiments.

FIG. 6A illustrates a cross-sectional view of DTI structures 601 in a substrate 101 in accordance with some embodiments, where an enlarged view of a region 607 of the substrate 101 is illustrated in FIG. 6B. A DTI structure 601 of the illustrated embodiment differs from the DTI structure 501 described above with reference to FIGS. 5A-5C by a structure of an epitaxial region 603, while a dielectric region 605 is similar to the dielectric region 505 of the DTI structure 501. In the illustrated embodiment, each epitaxial region 603 includes a plurality of first epitaxial layers 609 (not explicitly illustrated in FIG. 6A, but shown in FIG. 6B) comprising Si and a plurality of second epitaxial layers 611 (not explicitly illustrate in FIG. 6A, but shown in FIG. 6B) comprising $Si_{1-z}Ge_z$, which are formed in an alternating manner. In the illustrated embodiment, the first epitaxial layers 609 and the second epitaxial layers 611 form a superlattice structure with a period 613 comprising one of the first epitaxial layers 609 and one of the second epitaxial layers 611. In some embodiments, the first epitaxial layers 609 and the second epitaxial layers 611 may be formed using similar methods as various epitaxial layers of the epitaxial region 503 of the DTI structure 501 described above with reference to FIGS. 4-5C and the description is not repeated herein. In some embodiments, an atomic fraction z of Ge in the second epitaxial layers 611 may be between 0.1 about and about 1.0, a thickness of the first epitaxial layers 609 is between about 3 nm and about 20 nm, a thickness of the second epitaxial layers 611 is between about 3 nm and about 20 nm, and a number of the periods 613 in each epitaxial region 603 is between about 5 and about 50. By forming the epitaxial region 603 with a superlattice structure, a multi-quantum well structure is formed, which advantageously increases light absorption for wavelengths greater than about 1.5 μm (far infrared (FIR) band). In some embodiments, the DTI structures 601 form a grid similar to the grid illustrated in FIG. 5B.

Figure 7:
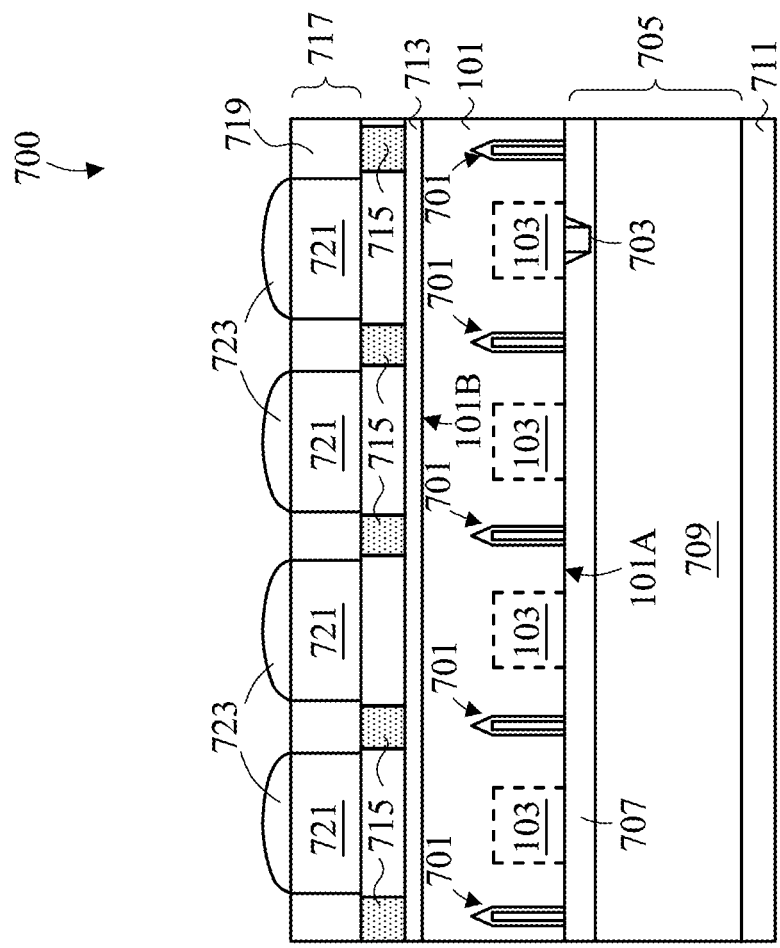
FIGS. 7-9 illustrate portions of a Backside Illumination (BSI) image sensor chip in accordance with some embodiments.
Figure 8:
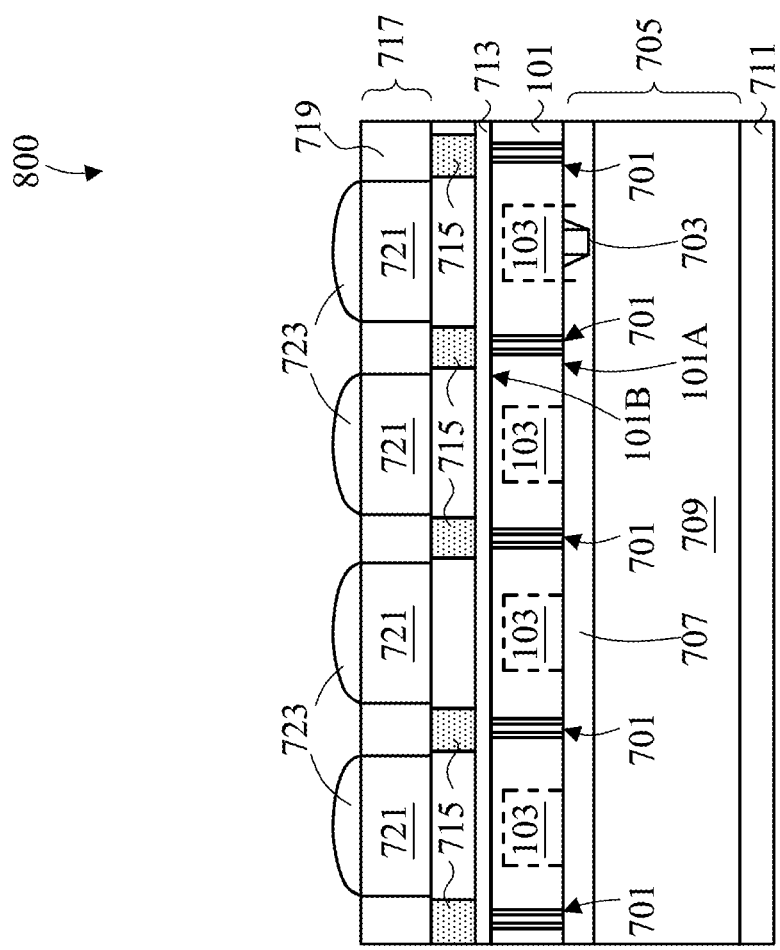
Figure 9:
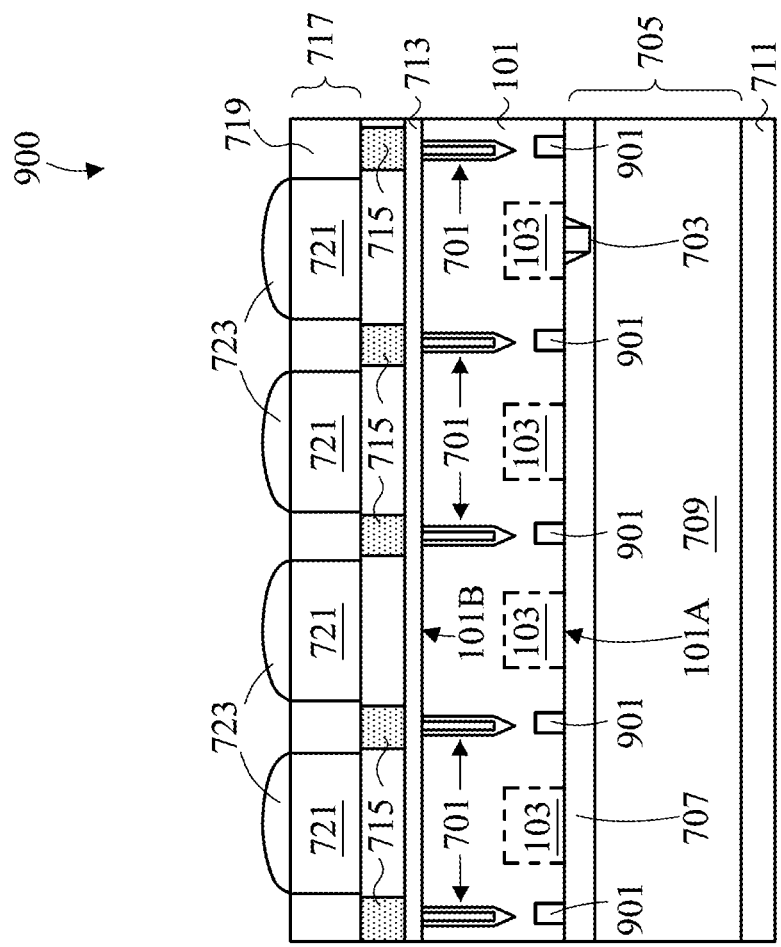

FIGS. 7-9 illustrate portions of BSI image sensor chips 700, 800 and 900, respectively, in accordance with some embodiments. In some embodiments, DTI structures such as the DTI structures 501 and 601 described above with reference to FIGS. 5A and 6A, respectively, are employed in the BSI image sensor chips 700, 800 and 900. In some embodiments, the BSI image sensor chips 700, 800 and 900 are configured such that light to be sensed by the photosensitive regions 103 enters the substrate 101 from the back surface 101B of the substrate 101. Referring to FIG. 7, the BSI image sensor chip 700 includes DTI structures 701 in the substrate 101, such that the DTI structures 701 form a grid similar to what is shown in FIG. 5B. In some embodiments, the DTI structures 701 may have a structure similar to the DTI structures 501 or 601 described above with reference to FIGS. 5A and 6A, respectively, and the description is not repeated herein. The DTI structures 701 extend from the front surface 101A of the substrate 101 towards the back surface 101B of the substrate 101. The photosensitive regions 103 are interposed between the adjacent DTI structures 701.

In some embodiments, one or more active and/or passive devices 703 (depicted as a single transistor in FIG. 7 for illustrative purposes) are formed on the front surface 101A of the substrate 101. The one or more active and/or passive devices 703 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for illustrative purposes only and are not meant to limit the present invention in any manner. Other circuitry may be used as appropriate for a given application.

An interconnect structure 705 may be formed on the front surface 101A of the substrate 101. Interconnect structure 705 may include an inter-layer dielectric (ILD) layer 707 and/or one or more inter-metal dielectric (IMD) layers 709 containing conductive features (e.g., conductive lines and vias comprising copper, aluminum, tungsten, combinations thereof, and the like) formed using any suitable method, such as damascene, dual damascene, or the like. The ILD 707 and IMDs 709 may include low-k dielectric materials having k values, for example, lower than about 4.0 or even 2.0 disposed between such conductive features. In some embodiments, the ILD 707 and IMDs 709 may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like. The interconnect structure electrically connects various active and/or passive devices (e.g., the photosensitive regions 104) to form electrical circuits within the BSI image sensor chip 700.

In some embodiments, a passivation layer 711 is formed on the interconnect structure 705. The passivation layer 711 may be formed of a non-low-k dielectric material having a k value greater than 3.9. In some embodiments, the passivation layer 711 may include one or more layers of silicon oxide, silicon nitride layer, or the like, and may formed using CVD, PECVD, thermal oxidation, or the like.

A bottom anti-reflective coating (BARC) layer 713 is formed on the back surface 101B of the substrate 101. In some embodiments, the BARC layer 713 comprises suitable dielectric materials such as silicon oxide, silicon nitride, silicon oxynitride, hafnium oxide, tantalum oxide, or a combination thereof, although other materials may be used. In some embodiments, the BARC layer 713 may be formed using ALD, CVD, PECVD, PVD, metal-organic chemical vapor deposition (MOCVD), or the like.

A metal grid 715 may be formed over the BARC layer 713 such that walls of the metal grid 715 are aligned to respective DTI structures 701. In some embodiments, the metal grid 715 may comprise titanium, titanium nitride, tantalum, tantalum nitride, aluminum, copper, nickel, tungsten, alloys thereof, or the like and may be formed using CVD, PVD, MOCVD, PDV, plating, or the like. A color filter layer 717 is formed over the metal grid 715. In some embodiments, the color filter layer 717 comprises a dielectric layer 719, for example, a silicon oxide layer with a plurality of color filters 721 formed therein. In some embodiments, the color filters 721 are aligned with respective photosensitive regions 103. The color filters 721 may comprise a polymeric material or resin, such as polymethyl-methacrylate (PMMA), polyglycidyl-methacrylate (PGMA), or the like, that includes colored pigments.

An array of microlenses 723 is formed over the color filter layer 717. In some embodiments, the microlenses 723 are aligned with respective color filters 721 and respective photosensitive regions 103. The microlenses 723 may be formed of any material that may be patterned and formed into lenses, such as a high transmittance acrylic polymer. In an embodiment, a microlens layer may be formed using a material in a liquid state by, for example, spin-on techniques. Other methods, such as CVD, PVD, or the like, may also be used. The planar material for the microlens layer may be patterned using suitable photolithography and etching methods to pattern the planar material in an array corresponding to the array of the active photosensitive devices. The planar material may then be reflowed to form an appropriate curved surface for the microlenses 723. Subsequently, the microlenses 723 may be cured using, for example, a UV treatment. In some embodiments, after forming the microlenses 723, the BSI image sensor chip 700 may undergo further processing such as, for example, packaging.

FIG. 8 illustrates a BSI image sensor chip 800 in accordance with some embodiments. The BSI image sensor chip 800 may be formed using similar materials and methods as the BSI image sensor chip 700 described above with reference to FIG. 7 and the description is not repeated herein. The BSI image sensor chip 800 differs from the BSI image sensor chip 700 by a structure of the back surface 101B of the substrate 101. In the illustrated embodiment, the back surface 101B of the substrate 101 is thinned until the DTI structures 701 are exposed. In some embodiments, the back surface 101B of the substrate 101 may be thinned using a CMP process, a grinding process, an etch process, or the like. In some embodiments, uppermost surfaces of the DTI structures 701 are substantially coplanar with the back surface 101B of the substrate 101.

FIG. 9 illustrates a BSI image sensor chip 900 in accordance with some embodiments. The BSI image sensor chip 900 may be formed using similar materials and methods as the BSI image sensor chip 700 described above with reference to FIG. 7 and the description is not repeated herein. In the illustrated embodiment, the DTI structures 701 are formed from the back surface 101B of the substrate 101, while the DTI structures 701 of the BSI image sensor chip 700 are formed from the front surface 101A of the substrate 101. In such embodiments, the DTI structures 701 may formed after forming the one or more active and/or passive devices 703, the interconnect structure 705 and/or the passivation layer 711. In some embodiments, the substrate 101 may comprise shallow trench isolation (STI) regions 901 interposed between adjacent photosensitive regions 103. In some embodiments, the STI structures may be formed by patterning the front surface 101A of the substrate 101 to form trenches in the substrate 101 and filling the trenches with suitable dielectric materials. STI regions 901 may be aligned with respective DTI structures 701.

Figure 10:
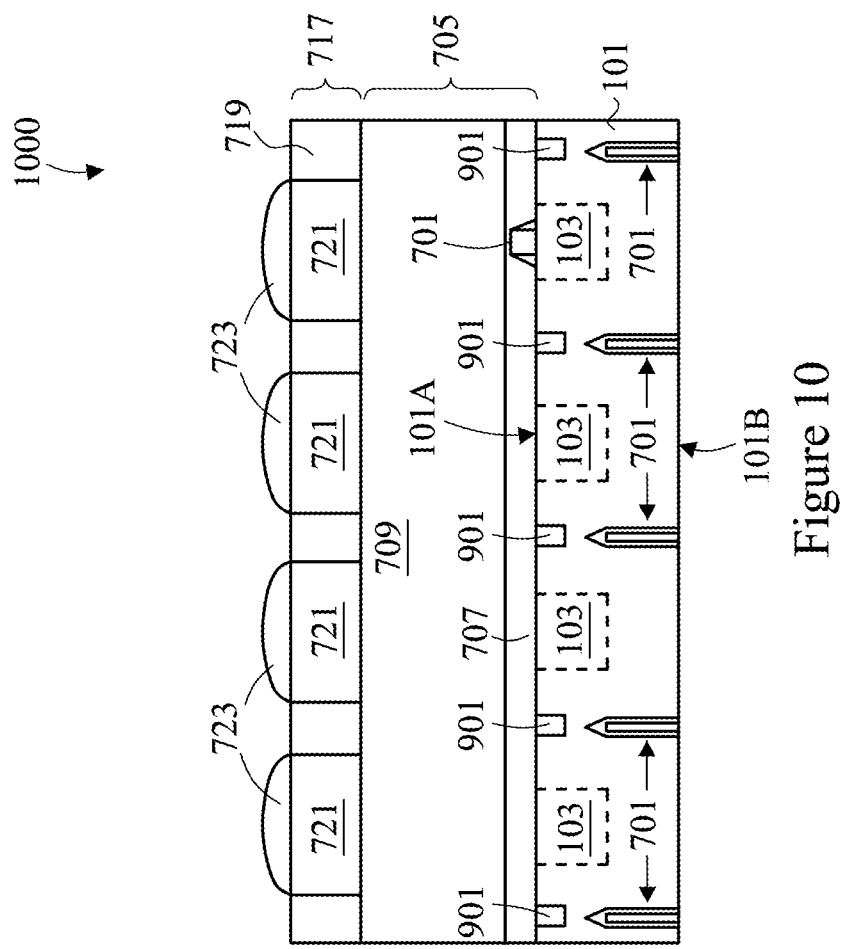
FIGS. 10 and 11 illustrate portions of a Front-Side Illumination (FSI) image sensor chip in accordance with some embodiments.
Figure 11:
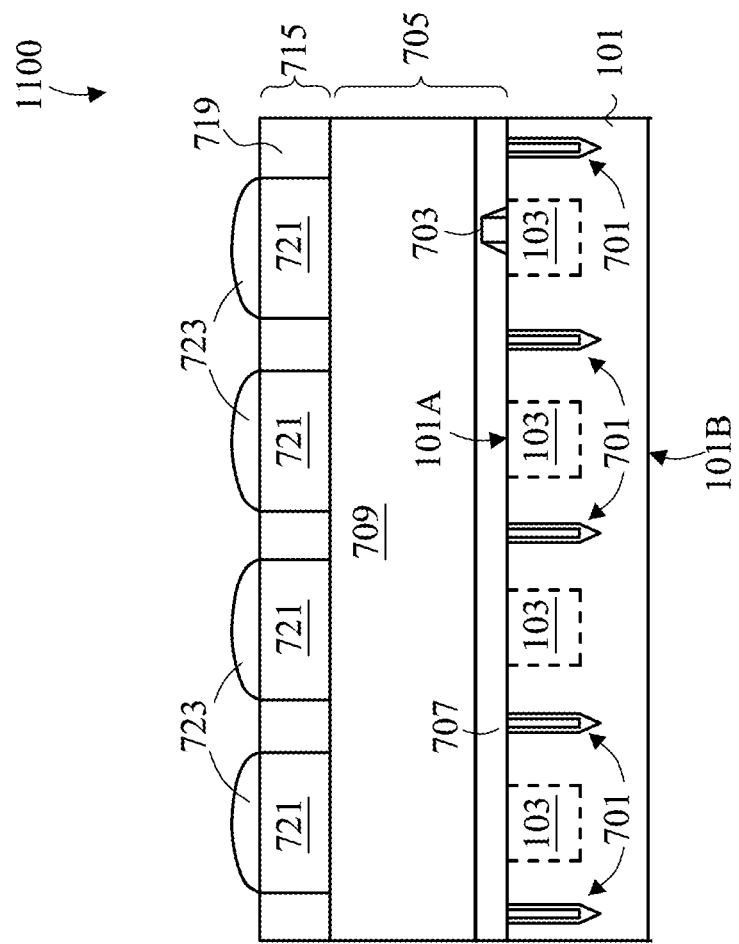

FIGS. 10 and 11 illustrate portions of FSI image sensor chips 1000 and 1100, respectively, in accordance with some embodiments. In some embodiments, the FSI image sensor chips 1000 and 1100 are configured such that light to be sensed by the photosensitive regions 103 enters the substrate 101 from the front surface 101A of the substrate 101. In some embodiments, the FSI image sensor chips 1000 and 1100 may formed using similar materials and methods as the BSI image sensor chips 700, 800 and 900 described above with reference to FIGS. 7-9, respectively, and the description is not repeated herein. Referring to FIG. 10, the DTI structures 701 are formed from the back surface 101B of the substrate 101. In such embodiments, the DTI structures 701 may formed after forming the one or more active and/or passive devices 703, the interconnect structure 705, the color filter layer 717 and/or the microlenses 723. Referring to FIG. 11, the DTI structures 701 are formed from the front surface 101A of the substrate 101.

Figure 12:
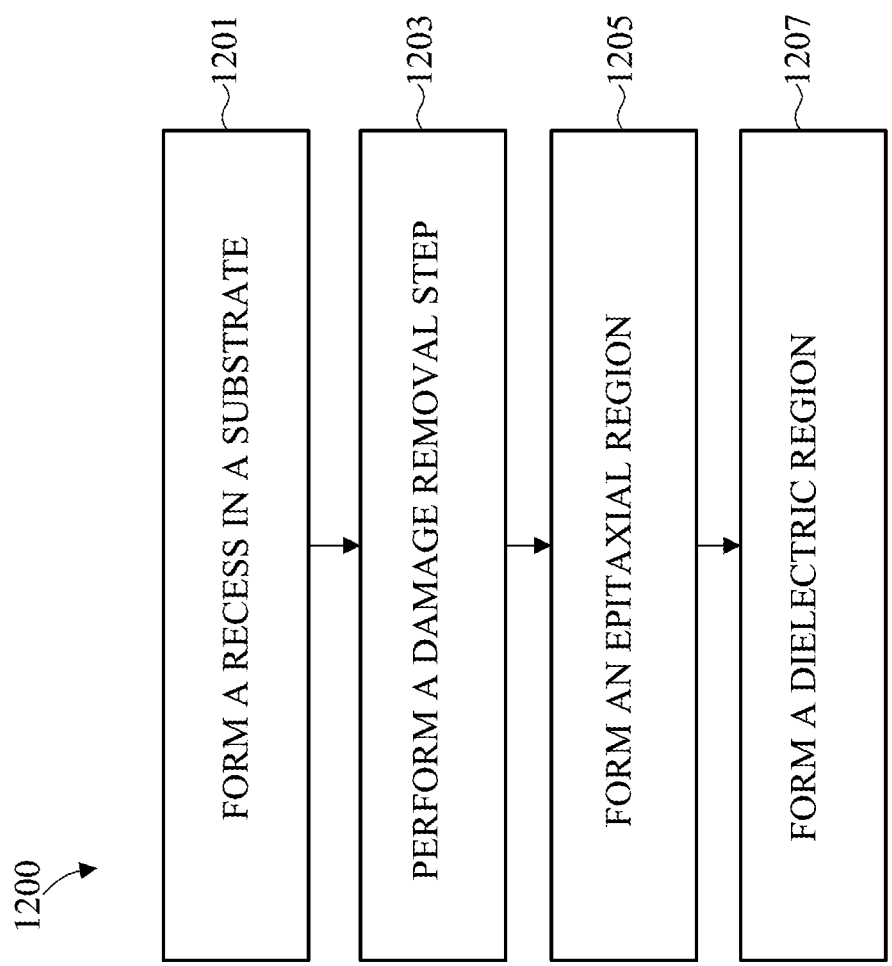
FIG. 12 is a flow diagram illustrating a method of forming deep trench isolation (DTI) structures in accordance with some embodiments.

FIG. 12 is a flow diagram illustrating a method 1200 of forming deep trench isolation (DTI) structures in accordance with some embodiments. The method 1200 starts with step 1201, where a recess (such as the recess 201 illustrated in FIG. 2) is formed in the substrate (such as the substrate 101 illustrated in FIG. 1) as described above with reference to FIGS. 1 and 2. In step 1203, damages portions of sidewalls and a bottom of the recess are removed as described above with reference to FIG. 3. In some embodiments, the damage removal step transforming the recess into a faceted recess (such as the recess 301 illustrated in FIG. 3) as described above with reference to FIG. 3. In step 1205, an epitaxial region (such as the epitaxial regions 503 and 603 illustrated in FIGS. 5A and 6A, respectively) is formed on sidewalls and a bottom of the faceted recess as described above with reference to FIGS. 4, 5A-5C, 6A and 6B. In step 1207, the faceted recess is filled with a dielectric material (such as the dielectric material 407 illustrated in FIG. 4) to form a dielectric region (such as the dielectric regions 505 and 605 illustrated in FIGS. 5A and 6A, respectively) as described above with reference to FIGS. 4, 5A-5C, 6A and 6B.

Various embodiments presented herein allow for forming deep trench isolation structures of an image sensor, which may provide several advantages. By including one or more epitaxial layers of SiGe in deep trench isolation structures, a light absorption coefficient in red, NIR and FIR regimes may be advantageously improved. Furthermore, the embodiments presented herein advantageously reduce a cross-talk between adjacent photosensitive regions of an image sensor.

According to an embodiment, a method includes forming a plurality of photosensitive regions in a substrate. A recess is formed in the substrate, the substrate comprising a first semiconductor material, the recess being interposed between adjacent photosensitive regions. The recess is enlarged by removing a damaged layer of the substrate along sidewalls of the recess, thereby forming an enlarged recess. An epitaxial region is formed on sidewalls and a bottom of the enlarged recess, at least a portion of the epitaxial region comprising a second semiconductor material, the second semiconductor material being different from the first semiconductor material. A dielectric region is formed on the epitaxial region, the epitaxial region extending along a sidewall of the dielectric region.

According to another embodiment, a method includes forming a plurality of photosensitive regions in a substrate, the substrate comprising a first semiconductor material. A plurality of faceted recesses are formed in the substrate, each of the plurality of faceted recesses being interposed between respective adjacent photosensitive regions. Epitaxial regions are formed in the plurality of faceted recesses, the epitaxial regions comprising a second semiconductor material, the second semiconductor material being different from the first semiconductor material. The plurality of faceted recesses are filled with a dielectric material.

According to yet another embodiment, a semiconductor structure includes a substrate, the substrate comprising a first semiconductor material, a photosensitive region in the substrate, and a deep trench isolation (DTI) structure adjacent the photosensitive region, the DTI structure extending from a first surface of the substrate into the substrate. The DTI structure includes an epitaxial region comprising a second semiconductor material, the second semiconductor material being different from the first semiconductor material, and a dielectric region, the epitaxial region extending along a sidewall of the dielectric region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of photosensitive regions in a substrate;
   forming a recess in the substrate, the substrate being formed of Si, the recess being interposed between adjacent photosensitive regions;
   enlarging the recess by removing a damaged layer of the substrate along sidewalls of the recess, thereby forming a faceted recess, the faceted recess having an upper portion, a lower portion, and a middle portion interposed between the upper portion and the lower portion, a width of the middle portion being greater than a width of the upper portion and a width of the lower portion, the width of the middle portion being greater than a width of the recess;
   forming an epitaxial region on sidewalls and a bottom of the faceted recess, the epitaxial region comprising a first epitaxial layer formed of B-doped Si, a second epitaxial layer formed of P-doped SiGe, and a third epitaxial layer formed of B-doped SiGe; and
   forming a dielectric region on the epitaxial region, the epitaxial region extending along a sidewall of the dielectric region;
   wherein top surfaces of the first epitaxial layer, the second epitaxial layer and the third epitaxial layer are faceted surfaces such that orientations of the faceted surfaces change as the epitaxial layers fill the faceted recess.

2. The method of claim 1, wherein forming the epitaxial region comprises forming one or more epitaxial layers of the P-doped SiGe.

3. The method of claim 1, wherein forming the epitaxial region comprises:
   growing the first epitaxial layer with a first set of source gases;
   growing the second epitaxial layer with a second set of source gases different from the first set of source gases; and
   growing the third epitaxial layer with a third set of source gases different from the first and the second set of source gases.

4. The method of claim 1, wherein forming the recess comprises performing an anisotropic dry etch process on the substrate.

5. The method of claim 1, wherein removing the damaged layer comprises performing an anisotropic wet etch process on the substrate.

6. The method of claim 1, wherein forming the dielectric region comprises:
filling the enlarged recess with a dielectric material; and
planarizing the dielectric material.

7. The method of claim 1, wherein the sidewalls and the bottom of the faceted recess have a plurality of facets.

8. A method comprising:
forming a plurality of photosensitive regions in a substrate, the substrate being formed of Si;
forming a plurality of recesses in the substrate, the recesses being interposed between adjacent photosensitive regions;
enlarging the recesses by removing a damaged layer of the substrate along sidewalls of the recesses, thereby forming a plurality of faceted recesses, each of the faceted recesses having an upper portion, a lower portion, and a middle portion interposed between the upper portion and the lower portion, a width of the middle portion being greater than a width of the upper portion and a width of the lower portion, the width of the middle portion being greater than a width of the plurality of recesses;
forming epitaxial regions on sidewalls and bottoms of the plurality of faceted recesses, the epitaxial regions comprising a first epitaxial layer formed of B-doped Si, a second epitaxial layer formed of P-doped SiGe, and a third epitaxial layer formed of B-doped SiGe; and
filling the plurality of faceted recesses with a dielectric material on the epitaxial regions;
wherein top surfaces of the first epitaxial layer, the second epitaxial layer and the third epitaxial layer are faceted surfaces such that orientations of the faceted surfaces change as the epitaxial layers fill the faceted recesses.

9. The method of claim 8, wherein forming the plurality of faceted recesses comprises:
performing a first etch process on the substrate to form a plurality of recesses therein; and
performing a second etch process on the substrate, the second etch process removing portions of sidewalls and bottoms of the plurality of recesses to form the plurality of faceted recesses.

10. The method of claim 9, wherein the first etch process is an anisotropic dry etch process, and wherein the second etch process is an anisotropic wet etch process.

11. The method of claim 8, wherein forming the epitaxial regions comprises:
forming the first epitaxial layer along sidewalls and bottoms of the plurality of faceted recesses;
forming the second epitaxial layer over the first epitaxial layer; and
forming the third epitaxial layer over the second epitaxial layer.

12. The method of claim 11, wherein the first epitaxial layer and the second epitaxial layer are formed using a selective epitaxial growth process.

13. The method of claim 8, further comprising planarizing the dielectric material, a uppermost surface of the dielectric material being substantially level with an uppermost surface of the substrate.

14. A method comprising:
forming a plurality of photosensitive regions in a substrate, the substrate comprising a first semiconductor element;
etching the substrate to form a recess in the substrate, the recess being interposed between adjacent photosensitive regions;
removing a damaged layer of the substrate along sidewalls and a bottom surface of the recess, thereby forming a reshaped recess, the reshaped recess having faceted sidewalls and a faceted bottom surface and having an upper portion, a lower portion, and a middle portion interposed between the upper portion and the lower portion, a width of the middle portion being greater than a width of the upper portion and a width of the lower portion, the width of the middle portion being greater than a width of the recess;
epitaxially growing a first epitaxial layer along the faceted sidewalls and the faceted bottom surface of the reshaped recess, the first epitaxial layer comprising the first semiconductor element, the first epitaxial layer grown with a first set of source gases;
epitaxially growing a second epitaxial layer over the first epitaxial layer, the second epitaxial layer comprising the first semiconductor element and a second semiconductor element, the second semiconductor element being different from the first semiconductor element, the second epitaxial layer grown with a second set of source gases different from the first set of source gases;
epitaxially growing a third epitaxial layer over the second epitaxial layer, the third epitaxial layer comprising the first semiconductor element and the second semiconductor element, the third epitaxial layer grown with a third set of source gases different from the first and the second set of source gases; and
filling the reshaped recess with a dielectric material on the third epitaxial layer;
wherein top surfaces of the first epitaxial layer, the second epitaxial layer and the third epitaxial layer are faceted surfaces such that orientations of the faceted surfaces change as the epitaxial layers fill the reshaped recess.

15. The method of claim 14, wherein removing the damaged layer of the substrate along the sidewalls and the bottom surface of the recess comprises etching the damaged layer of the substrate.

16. The method of claim 14, wherein, during epitaxially growing the second epitaxial layer over the first epitaxial layer, an amount of the second set of source gases for the second semiconductor element is gradually increased.

17. The method of claim 14, further comprising doping the first epitaxial layer and the second epitaxial layer.

18. The method of claim 14, wherein, during epitaxially growing the second epitaxial layer over the first epitaxial layer, an atomic fraction of the second semiconductor element in the second epitaxial layer is increased as a thickness of the second epitaxial layer is increased.

19. The method of claim 14, wherein the first semiconductor element is Si, and wherein the second semiconductor element is Ge.

20. The method of claim 14, wherein:
the first set of source gases includes a Si source gas and a B source gas;
the second set of source gases includes the Si source gas, a Ge source gas, and a P source gas; and
the third set of source gases includes the Si source gas, the Ge source gas, and the B source gas.

* * * * *